(12) United States Patent
Raorane et al.

(10) Patent No.: US 9,041,207 B2
(45) Date of Patent: May 26, 2015

(54) METHOD TO INCREASE I/O DENSITY AND REDUCE LAYER COUNTS IN BBUL PACKAGES

(71) Applicants: Digvijay A. Raorane, Chandler, AZ (US); Sairam Agraharam, Chandler, AZ (US)

(72) Inventors: Digvijay A. Raorane, Chandler, AZ (US); Sairam Agraharam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/931,006

(22) Filed: Jun. 28, 2013

(65) Prior Publication Data

US 2015/0001730 A1    Jan. 1, 2015

(51) Int. Cl.
*H01L 23/528*    (2006.01)
*H01L 23/00*    (2006.01)

(52) U.S. Cl.
CPC .............. *H01L 23/528* (2013.01); *H01L 24/82* (2013.01)

(58) Field of Classification Search
CPC .... H01L 2224/82; H01L 24/82; H01L 23/528
USPC .......................................... 257/773; 438/106
See application file for complete search history.

(56) References Cited

U.S. PATENT DOCUMENTS

| 7,238,602 | B2 * | 7/2007 | Yang | 438/613 |
| 8,018,043 | B2 * | 9/2011 | Suh et al. | 257/690 |
| 2004/0070064 | A1 * | 4/2004 | Yamane et al. | 257/686 |
| 2006/0087037 | A1 * | 4/2006 | Hsu | 257/738 |
| 2008/0029895 | A1 * | 2/2008 | Hu et al. | 257/762 |
| 2011/0227223 | A1 * | 9/2011 | Wu et al. | 257/738 |
| 2012/0049364 | A1 * | 3/2012 | Sutardja et al. | 257/738 |
| 2012/0074580 | A1 * | 3/2012 | Nalla et al. | 257/774 |
| 2014/0091442 | A1 * | 4/2014 | Cheah et al. | 257/666 |

* cited by examiner

*Primary Examiner* — Luan C Thai
(74) *Attorney, Agent, or Firm* — Blakely, Sokoloff, Taylor & Zafman LLP

(57) ABSTRACT

An apparatus including a die including a dielectric material on a device side, an insulating layer surrounding a die area and embedding a thickness dimension of the die; and a carrier including a plurality of layers of conductive material disposed on the device side of the die, a first one of the layers of conductive materials being formed on the insulating layer and patterned into traces at least a portion of which are connected to respective contact points on the die. A method including disposing a die on a sacrificial substrate with a device side of the die opposite the sacrificial substrate; disposing a mold on the sacrificial substrate around; introducing an insulating material into a chase of the mold; removing the mold; forming a carrier on the insulating material adjacent a device side of a die; and separating the die and the carrier from the sacrificial substrate.

14 Claims, 7 Drawing Sheets

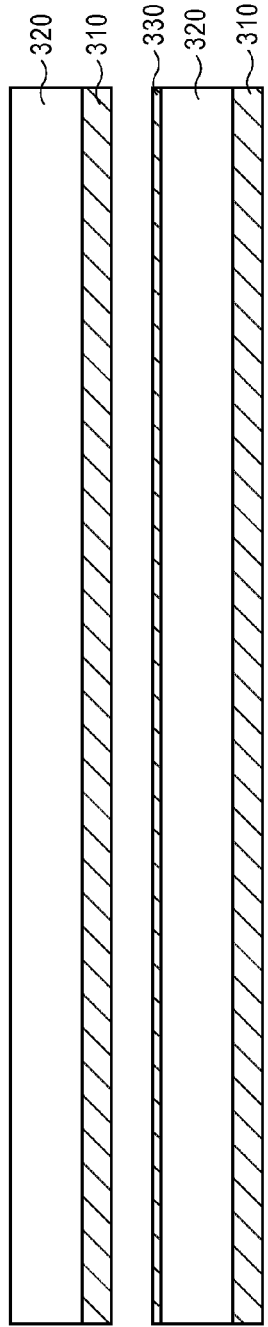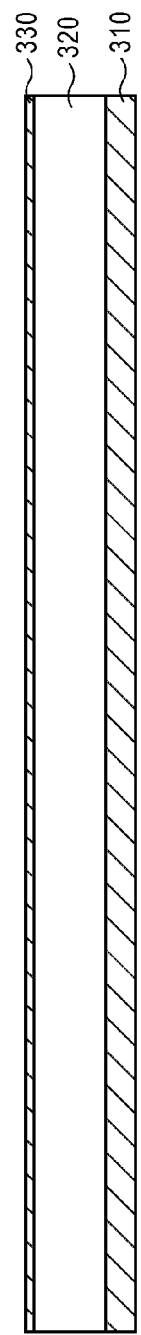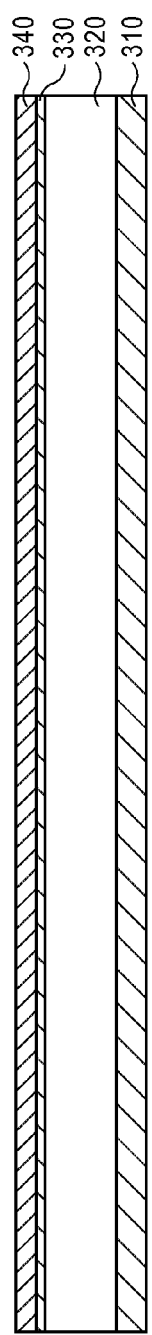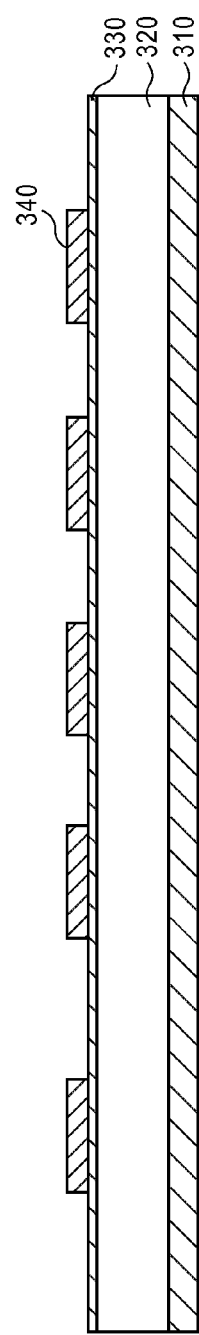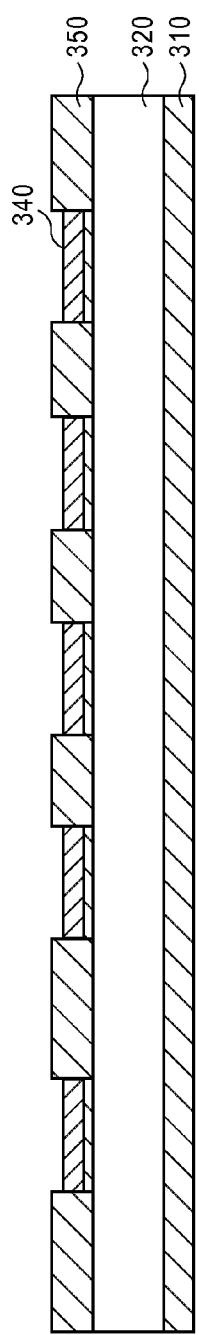

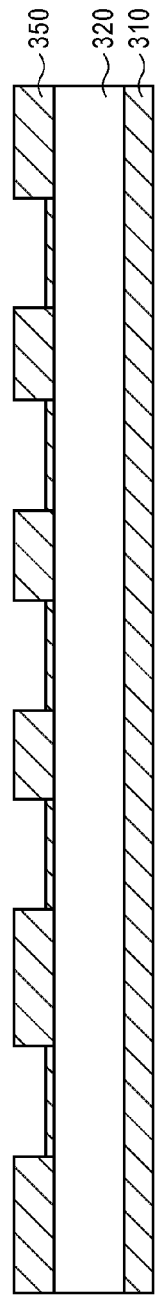
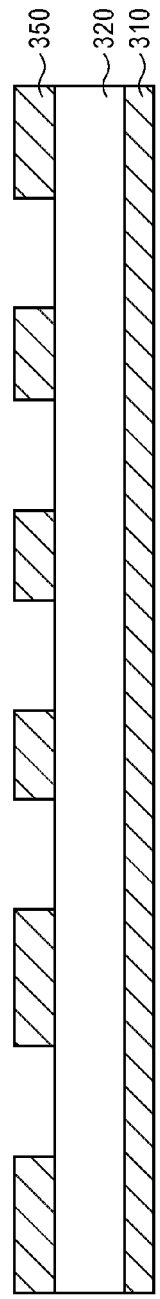
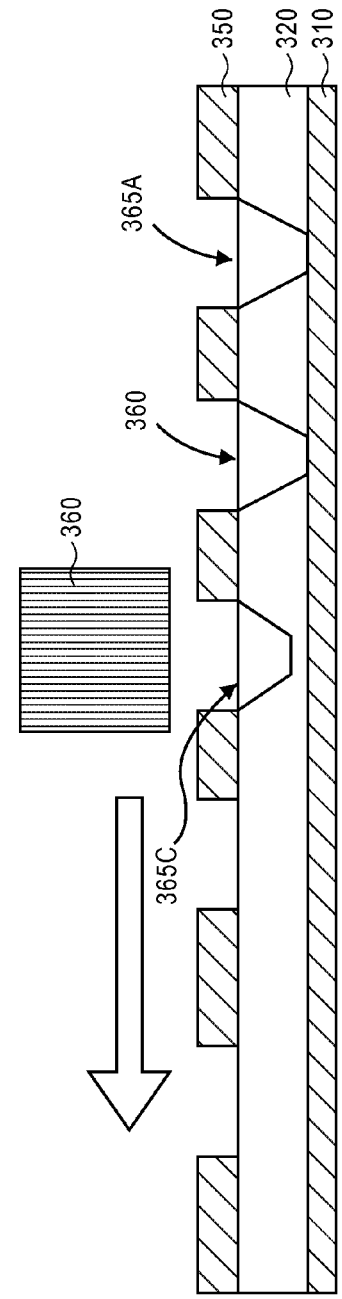
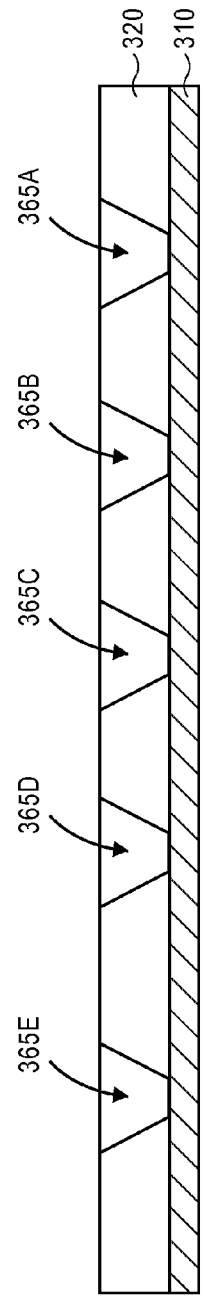
FIG. 16
FIG. 17
FIG. 18
FIG. 19

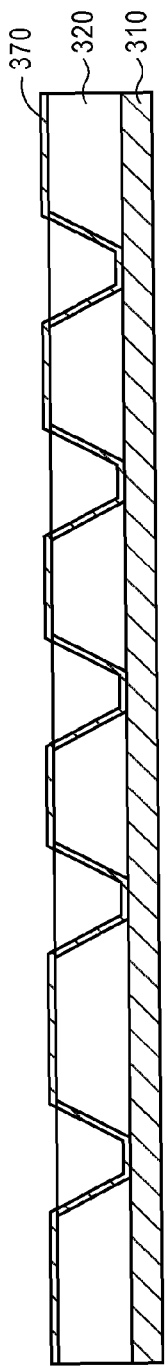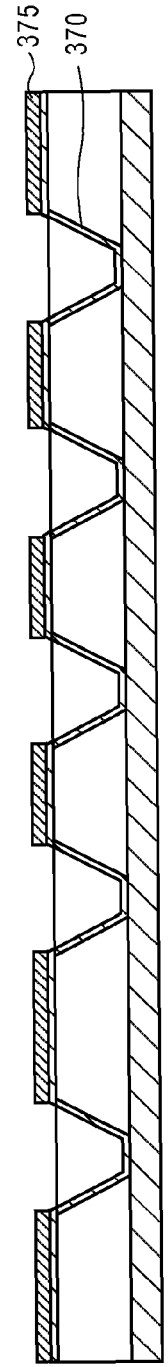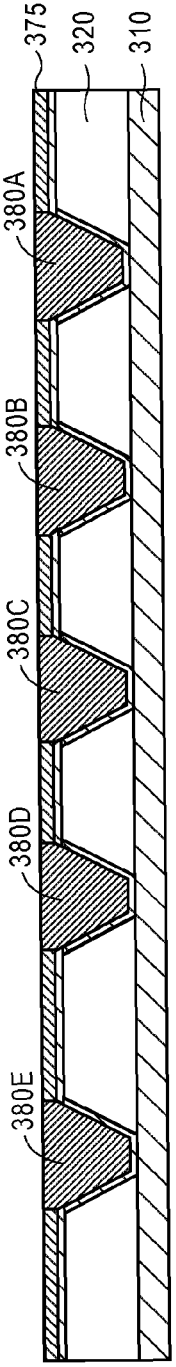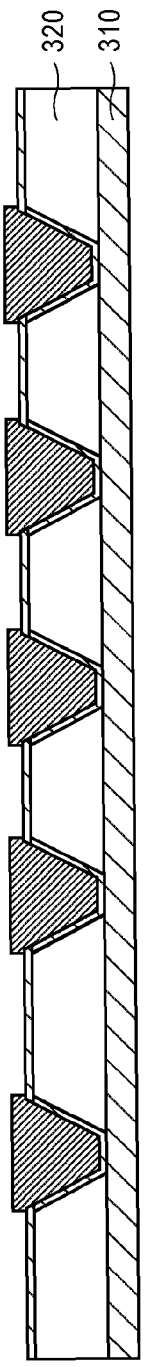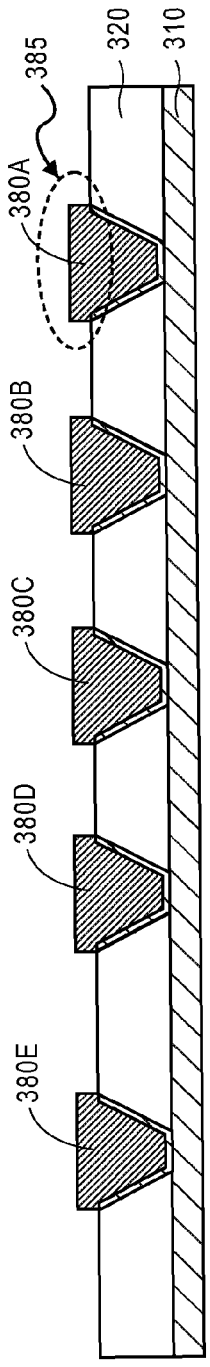

METHOD TO INCREASE I/O DENSITY AND REDUCE LAYER COUNTS IN BBUL PACKAGES

BACKGROUND

1. Field

Packaging for microelectronic devices.

2. Description of Related Art

Microelectronic packaging technology, including methods to mechanically and electrically attach a silicon die (e.g., a microprocessor) to a substrate or other carrier continues to be refined and improved. Bumpless Build-Up Layer (BBUL) packaging technology is one approach to a packaging architecture. Among its advantages, BBUL packaging technology eliminates the need for assembly, eliminates prior solder ball interconnections (e.g., flip-chip interconnections), reduces stress on low-k interlayer dielectric of dies due to die-to-substrate coefficient of thermal expansion (CTE mismatch), and reduces package inductance through elimination of core and flip-chip interconnect for improved input/output (I/O) and power delivery performance.

BRIEF DESCRIPTION OF THE DRAWINGS

FIG. 11 shows a cross-sectional side view of a patterned metal conductive layer in a method of forming a build-up package with a dielectric layer on the conductive layer.

FIG. 12 shows the structure of FIG. 11 following the introduction of a seed layer on the dielectric layer.

FIG. 13 shows the structure of FIG. 12 following the introduction of a masking layer on conductive layer.

FIG. 14 shows the structure of FIG. 13 following the patterning of masking layer.

FIG. 15 shows the structure of FIG. 14 following the introduction of conductive material to form a hard mask on dielectric layer.

FIG. 16 shows the structure of FIG. 15 following the removal of masking material.

FIG. 17 shows the structure of FIG. 16 following the removal of the remnant portions of the seed layer.

FIG. 18 shows the structure of FIG. 12 and an example of a via formation process.

FIG. 19 shows the structure of FIG. 18 following the completion of vias in the dielectric layer.

FIG. 20 shows the structure of FIG. 19 following the introduction of a seed material as a blanket over the dielectric layer and in vias.

FIG. 21 shows the structure of FIG. 20 following the introduction and patterning of masking material on the structure to expose the vias.

FIG. 22 shows the structure of FIG. 21 following the introduction of conductive material in the vias.

FIG. 23 shows the structure of FIG. 22 following the removal of masking layer.

FIG. 24 shows the structure of FIG. 23 following the removal of seed layer.

DETAILED DESCRIPTION

Figure 1:
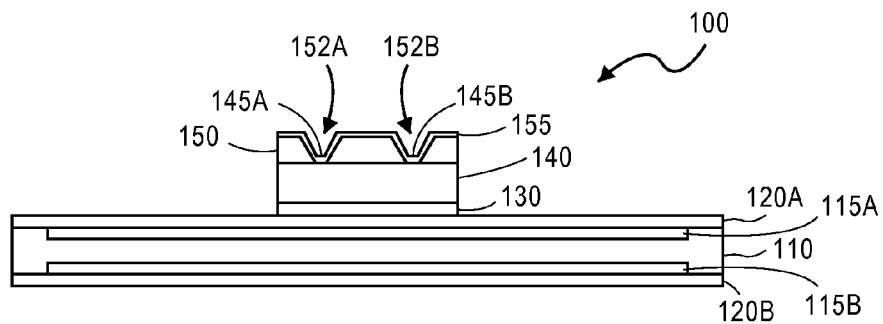
FIG. 1 shows a cross-sectional side view of a portion of a sacrificial substrate including foil layers on opposing sides.

FIGS. 1-9 show one embodiment of a method of forming a microelectronic package using bumpless build-up layer (BBUL) technology. FIG. 1 shows a cross-sectional side view of a portion of a sacrificial substrate (substrate 110) of, for example, a prepeg material including opposing layers of copper foils 120A and 120B that are separated from sacrificial substrate 110 by shorter copper foil layers 115A and 115B, respectively. One technique in forming package assembly using build-up technology is to form package assembly on opposite sides of sacrificial substrate 110. This discussion will focus on the formation of a package assembly on one side of sacrificial substrate 110 (the "A" side). It is appreciated that a second package assembly can simultaneously or sequentially be formed on the opposite side (the "B" side).

FIG. 1 shows die 140 mounted on copper foil 120A through adhesive 130 such as die back side film (DBF) polymer/epoxy base adhesive with or without fillers. In another embodiment, more than one die may be mounted on copper foil 120A.

Die 140 is mounted with a device side away from the copper foil. Die 140 includes on its device side a number of contact points (contact point 145A and contact point 145B illustrated in FIG. 1). Overlying a surface including the contact points is dielectric material 150 of, for example, WPR, commercially available from JSR Micro, Inc. of Sunnyvale, Calif. Dielectric material 150 is conventionally introduced during die fabrication as a layer over a surface including the plurality of contact points. Through vias (TVO) are also opened to the respective contact points at the die fabrication stage. FIG. 1 shows through via 152A to contact point 145A and through via 152B to contact point 145B. Also during die fabrication, a conductive layer is introduced over dielectric material 150. FIG. 1 shows conductive layer 155 of, for example, titanium and copper (e.g., multiple layers). The conductive layer(s) is introduced conformally over dielectric material 150 such that the conductive layer is also present in the through vias (along the sidewalls of through vias 152A and 152B). Such conductive layer(s) are representatively introduced by sputtering.

Figure 2:
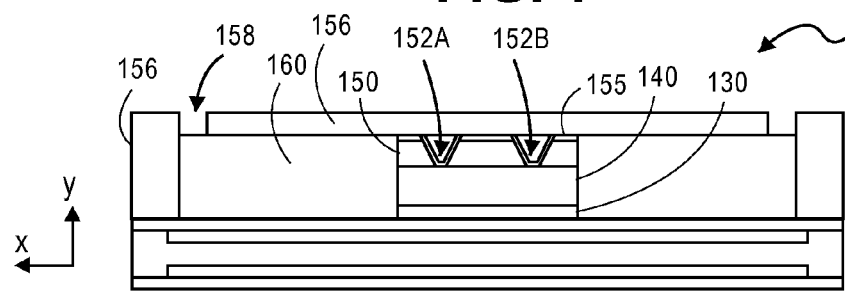
FIG. 2 shows the structure of FIG. 1 following the introduction of a mold on the sacrificial substrate and a dielectric into a chase of the mold.

FIG. 2 shows the structure of FIG. 1 following the introduction of a mold on copper foil 120A. FIG. 2 shows mold chase 156 placed around die 140 and, in one embodiment, has a height dimension suitable to envelope die 140 including dielectric material 150 and conductive layer(s) 155. Thus, as illustrated in FIG. 2, mold chase 156 has a volume to encompass opposing lateral sides of die 140 including dielectric material 150 and conductive layer(s) 155 and, in one embodiment, an area defined by a length and width dimension (x- and z-dimension) similar to that of build-up layers to be formed on sacrificial substrate 110. In one embodiment, mold chase 156 of, for example, a metal material serves to confine mold material to around the sidewall surfaces of die 140. As illustrated in FIG. 2, disposed within the mold chase is an insulating material of, for example, an epoxy that forms insulating layer 160. Representatively, insulating layer 160 of an epoxy, such as a 9740 epoxy from Hitachi Chemical Co., Ltd., is introduced as a liquid through openings 158 in mold chase 156. Once introduced, the epoxy is allowed to cure or solidify.

Figure 3:
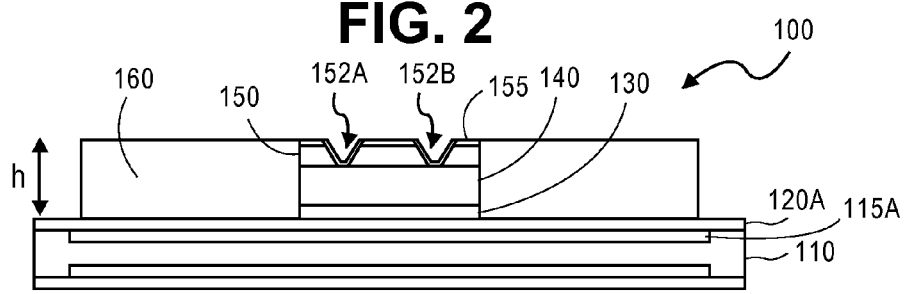
FIG. 3 shows the structure of FIG. 2 following a removal of the mold from the structure.

FIG. 3 shows the structure of FIG. 2 following a removal of mold chase 156 from structure 100. FIG. 3 shows insulating layer 160 encompassing each of the lateral sides of die 140 and extending to a level equivalent to a height, h, of die 140 inclusive of, in one embodiment, a thickness of dielectric material 150 and, in another embodiment, inclusive of a thickness of dielectric material 150 and conductive layer(s) 155. Thus, in such embodiments insulating layer 160 embeds the side walls of dielectric material 150 or the side walls of dielectric material 150 and conductive layer(s) 155 but is not present on a surface of die 140 including dielectric material 150 and conductive layer(s) 155.

Figure 4:
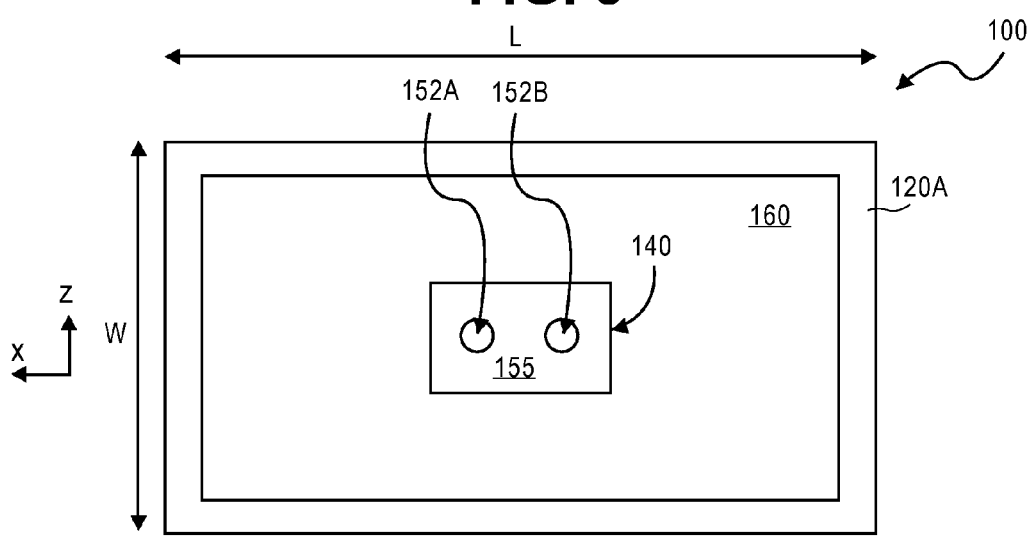
FIG. 4 shows a top view of the structure of FIG. 3.

FIG. 4 shows a top view of structure 100 of FIG. 3. FIG. 4 shows insulating layer 160 encompassing each of the lateral sides of die 140 and having an area defined by a length, L, and width, W, direction, in this embodiment, similar to an area for a build-up package to be assembled on the structure. FIG. 4 also shows a surface of die 140 including conductive layer(s) 155 and vias to contact points on the die. In this embodiment, only two vias (via 152A and via 152B) are shown to respective contact points (contact point 145A and contact point 145B (FIG. 1)). It is appreciated that a typical die, such as a microprocessor, may have a number of contact points and vias.

Figure 5:
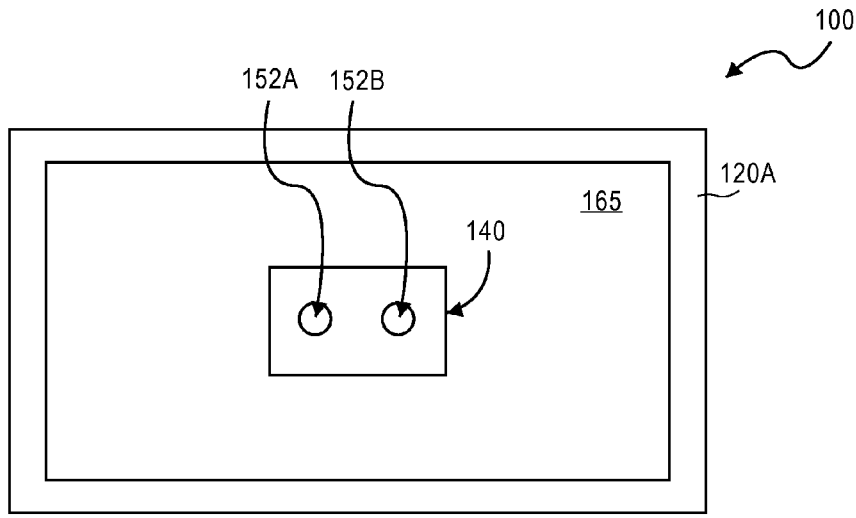
FIG. 5 shows the structure of FIG. 4 following the introduction of conductive material on a surface of dielectric material.

FIG. 5 shows the structure of FIG. 4 following the introduction of conductive material on the surface of insulating layer 160. In one embodiment, conductive material 165 is copper introduced by electroless deposition as a blanket on the exposed surface of insulating layer 160.

Figure 6:
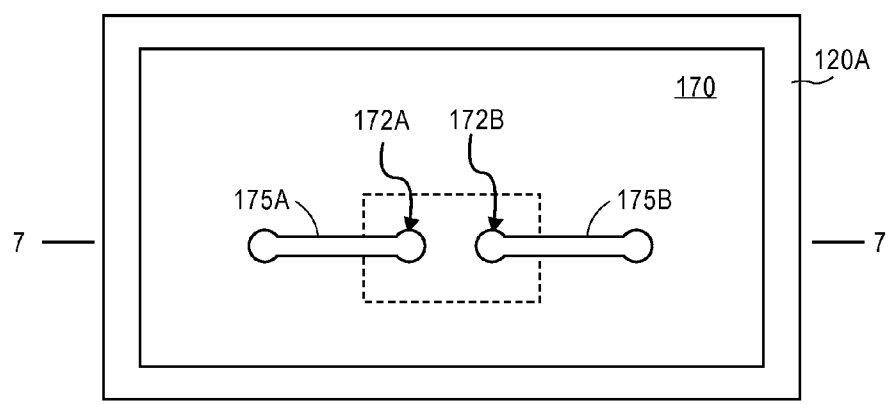
FIG. 6 shows the structure of FIG. 5 following the introduction of patterning of a sacrificial material on the conductive material and a conductive material to form conductive through vias and traces.

FIG. 6 shows the structure of FIG. 5 following the introduction and patterning of a sacrificial material on conductive material 165. In one embodiment, sacrificial material is a dry film resist (DFR) introduced by laminating a film on conductive material 165 and patterning the film to define openings for conductive through vias (TV1) in via 152A and via 152B and openings for traces from respective ones of the conductive through vias. Photolithographic techniques may be used to form the pattern in the DFR.

FIG. 6 also shows the structure following the introduction of a conductive material in via 152A and via 152B and formation of traces. Representatively, FIG. 6 shows conductive through via 172A (TV1) and trace 175A extending from conductive through via 172A. FIG. 6 also shows conductive through via 172B (TV1) and trace 175B extending from conductive through via 172B. In one embodiment, a conductive material for the through vias and traces is copper introduced by an electroplating process. Trace 175A and trace 175B are each disposed on a surface defined by dielectric material 150 and insulating layer 160.

Figure 7:
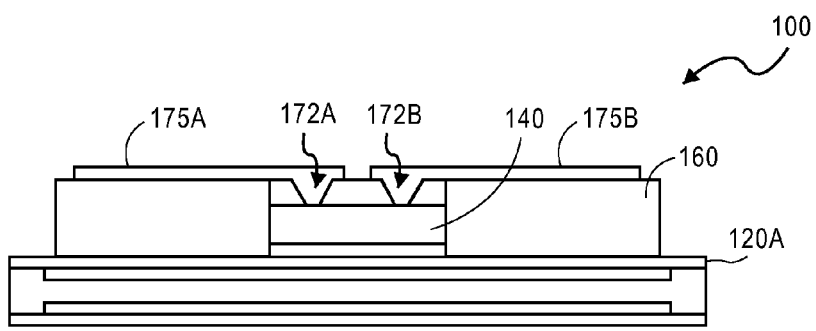
FIG. 7 shows a cross-sectional side view of the structure of FIG. 6 through line 7-7' following the removal of sacrificial layer.

FIG. 7 shows a cross-sectional side view through line 7-7' of the structure of FIG. 6 following the removal of sacrificial layer 170. In one embodiment, a sacrificial material such as DFR may be stripped off using a stripper. FIG. 7 also shows the structure following the removal of conductive material 165 from a surface of insulating layer 160 exclusive of the traces and conductive through vias. In one embodiment, a conductive material such as copper may be removed by a flash etch and wet etch may be used to remove a conductive material of titanium (where titanium and copper are coated on top of die 140 during the die manufacturing process as conductive layer(s) 155). Alternatively, a dry plasma may be used to remove titanium. FIG. 7 shows dielectric layer including trace 175A and trace 175B extending on insulating layer 160 from conductive through via 172A and conductive through via 172B, respectively.

Prior art processes typically plate a copper bump on a dielectric layer of a device side of a die during the die fabrication stage; mount the die on a sacrificial substrate for package formation; laminate an ABF layer or multiple layers of ABF on the die; and form vias (VO) through the ABF to the copper bumps. Forming vias through the ABF to the copper bumps is challenging and can result in yield loss due to misalignment of vias over pads. Also, a thick ABF on a die can lead to smaller via diameters at the base of the film (and corresponding larger aspect ratios) that make the vias more difficult to clean (e.g., with desmear solution) which can lead to delamination. The reduced diameter of the vias also makes formation of conductive contact with copper bumps more difficult. A thick ABF can also produce non-uniformities in the overall film.

In the process described herein, insulating layer 160 is used to encompass lateral sidewalls of die 140 and leave exposed a surface of the die including a dielectric layer and vias to contact points on the die. The vias (VO) are converted to conductive through vias (TV1) for routing traces in a first level of conductive material.

Prior art schemes of forming vias to copper bumps tend to result in traces having a greater width (e.g., fatter traces). Also, copper bumps on dies tend to be larger in size (and hence, have a comparatively smaller gap or separation among them) to allow good alignment of VO on top of Cu bump. Thus, fewer traces can be routed in that gap or separation or space requiring the fanning of traces in additional routing layers (i.e., additional build-up layers). One reason is the alignment of the traces (L1) is defined in one aspect by the use of a laser to form the vias (VO) drilled on top of Cu bumps. To avoid misalignment to a laser drilled via on top of a copper bump, an area of a lithography pad is sized to ensure that the pad lands on top of the via (e.g., a 78 micron pad for a 30 micro via). The larger the area of the pad, the fewer number of pads can fit in a given area and smaller would be the space among pads to route traces.

Routing traces directly from conductive through vias 172A and 172B formed on insulating layer 160 provides improved accuracy of alignment because the alignment is defined by lithography rather than laser drilling. Routing traces directly from conductive through vias 172A and 172B also provides more space available for routing traces. Conductive through vias 172A and 172B tend to be smaller in size than plated copper bumps (e.g., 35× smaller) and tend to have a larger gap or separation available among them. Thus, routing traces is easier and multiple traces could be fit in areas among vias. Also, since the vias are smaller in size (e.g., smaller diameter), reduced dimension (reduced width) traces could be used. Reduced dimension traces allow greater flexibility in routing, including a reduction in routing layers. The benefit of a reduction in routing layers is fewer build-up layers in BBUL packages and a significant reduction in cost.

Figure 8:
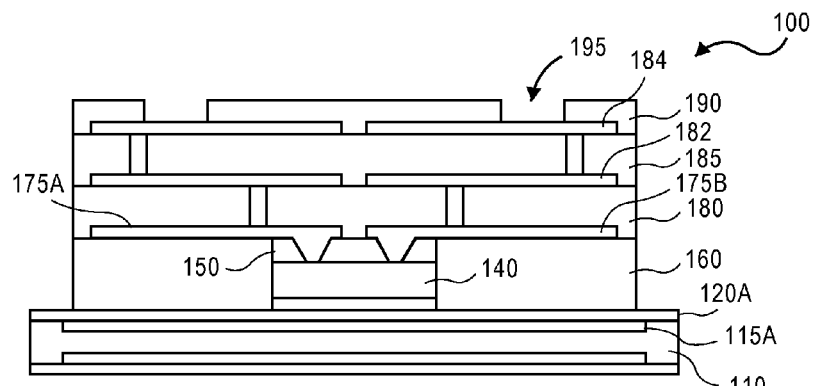
FIG. 8 shows the structure of FIG. 7 following the introduction of build-up layers.

FIG. 8 shows the structure of FIG. 7 following the introduction of additional build-up layers. In this embodiment, only three conductive layers are used, including the conductive layer on insulating layer 160 represented by trace 175A and trace 175B. The three levels of conductive layer represent, for example, signal, ground and power layers. Overlying trace 175A and trace 175B representative of a first conductive layer is dielectric layer 180 of, for example, an ABF that is, for example, laminated as a film on the structure. The presence of insulating layer 160 across the structure, including beyond an area represented by die 140, provides a planar surface onto which dielectric layer 180 is introduced. The planar surface tends to increase the uniformity of dielectric layer 180 such as ABF. Overlying dielectric layer 180 is second conductive layer 182 patterned of, for example, copper. In one embodiment, conductive layer 182 may be introduced and patterned through photolithographic and plating techniques. FIG. 8 also shows conductive through vias formed between conductive layer 182 and the first conductive layer (represented by trace 175A and trace 175B). Such conductive through vias are representatively formed by drilling and plating processes. Overlying conductive layer 182 is dielectric layer 185 of, for example, ABF or ABF glass cloth. Overlying dielectric layer 185 is third conductive layer 184 of, for example, patterned copper. Conductive vias are illustrated in dielectric layer 185 between conductive layer 184 and conductive layer 182. Overlying conductive layer 184 is dielectric layer 190 such as ABF or a solder resist film. Dielectric layer 190, for example, of a solder resist, is patterned and developed to define openings 195 for connection to a substrate, such as a printed circuit board (e.g., solder connections).

Figure 9:
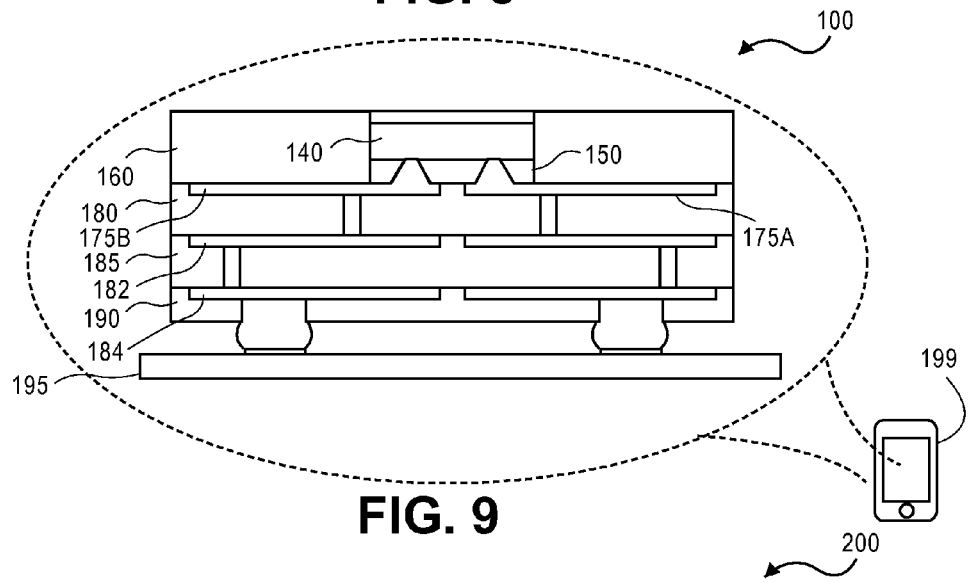
FIG. 9 shows the structure of FIG. 8 following the removal of the package including a die from the copper foil and substrate and the connection of the package to a printed circuit board.

FIG. 9 shows the structure of FIG. 8 following the removal of the package including die 140 from copper foil 120A and substrate 110. In this embodiment, structure 100 is in FIG. 9 is inverted and connected through solder connections to printed circuit board 195 and forms part of an assembly such as smart phone 199 or other computing device 100.

Figure 10:
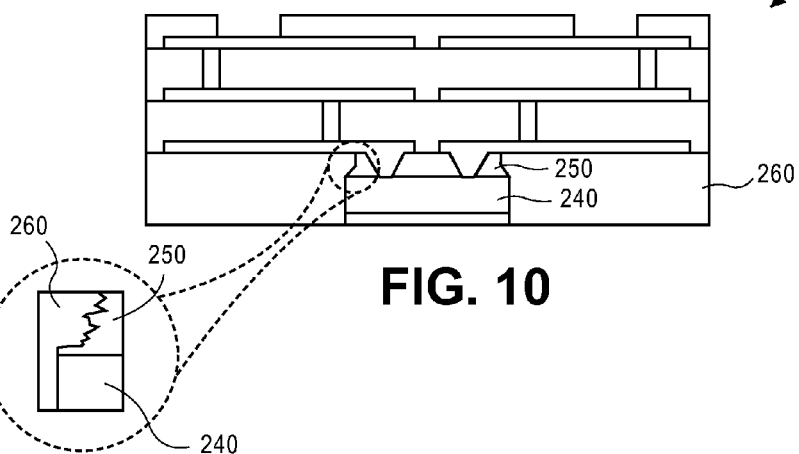
FIG. 10 shows another embodiment of a portion of a package structure.

FIG. 10 shows another embodiment of a portion of a package structure. In this embodiment, the edges of a dielectric layer on a die along its periphery are given an irregular surface. FIG. 10 shows structure 200 (a package) including die 240 embedded in dielectric layer 260 through, for example, a epoxy casting process such as described above and build-up layers formed on the die. Die 240 includes dielectric layer 250 on a device side of the die. In one embodiment, dielectric layer 250 is, for example, a WPR material. The dielectric layer is introduced, in one embodiment, at the die fabrication stage as noted above, as are, for example, vias to contact points on the die. Dielectric layer 250, in this embodiment, is modified such that a perimeter edge of dielectric layer 250 has an irregular shape. FIG. 10 illustrates the shape as approximately concave. One way this may be done is by skiving of dielectric layer 250 along its perimeter. Such skiving leads to increase in a cross-sectional area of the dielectric material (e.g., WPR) that is exposed to a dielectric that is to become dielectric layer 260. An inset in FIG. 10 shows an exploded portion of one side of die 240 at dielectric layer 250. The exploded view shows an edge of dielectric layer 250 having an irregular shape and dielectric material 260 conforming to that shape as would occur, where, for example, dielectric material 260 is an epoxy introduced into a chase of a mold. The irregular surface of dielectric layer 250 increased an interface (contact area) between the dielectric layer and dielectric material 260, which increases the adhesion between the two materials. The modification (e.g., skiving) of dielectric layer 250 is performed, in one embodiment, prior to placing a die on a sacrificial substrate and introducing the dielectric material 260. The modification of dielectric layer 250 can be to the entire perimeter or, in another embodiment, to a portion less than an entire perimeter (e.g., a pair of opposing sides). The remainder of the process to form structure 200, in one embodiment, is similar to that described above with respect to FIGS. 1-9 and the formation of structure 100.

FIGS. 11-24 shows an embodiment of a method for forming conductive through vias to patterned metal lines in, for example, a BBUL process. With regard to the method of forming a BBUL package describe with respect to FIGS. 1-9, the method is applicable to, for example, forming conductive through vias to traces representative of a first metal layer (e.g., trace 175A, trace 175B of structure 100 in FIG. 1-9) and subsequent metal layers. Thus, in one embodiment, a die mount process, embedment in dielectric material such as an epoxy, and the formation of a patterned first conductive layer are as described above with respect to FIG. 1-7. In the illustration of process that follows, a die or dies have not been shown on a panel nor has the underlying sacrificial substrate on which the package is formed.

Referring to FIG. 11, FIG. 11 shows conductive layer 310 of, for example, copper that is introduced and patterned on an underlying dielectric layer. Overlying conductive layer 310 in FIG. 11 is dielectric layer 320 of, for example, ABF laminated on the structure.

In one embodiment, a hard mask will be introduced to be utilized to form the vias through dielectric layer 320 to patterned traces of underlying conductive layer 310. Such hard mask is, for example, a metal material introduced through a semi-additive process or by sputtering. As shown in FIG. 12, in a semi-additive process, in one embodiment, conductive layer 330 (a seed layer) of a material such as copper is introduced through an electroless plating process.

FIG. 13 shows the structure of FIG. 12 following the introduction of a masking layer on conductive layer 330. FIG. 13 shows masking layer 340 of, for example, DFR introduced on conductive layer 330.

FIG. 14 shows the structure of FIG. 13 following the patterning of masking layer 340. In one embodiment, masking layer 340 is patterned through photolithographic techniques to expose conductive layer 330 in areas where openings through the conductive layer are not to be formed and to leave masking material in areas for desired via openings.

FIG. 15 shows the structure of FIG. 14 following the introduction of conductive material to form a hard mask on dielectric layer 320. In a semi-additive process such as described, in one embodiment, copper is electroplated to exposed portions of conductive layer 330 on the structure (portions of conductive layer 330 not protected by masking layer 340).

FIG. 16 shows the structure of FIG. 15 following the removal of masking layer 340. A masking layer of a material such as DFR may be removed by stripping.

FIG. 17 shows the structure of FIG. 16 following the removal of the remnant portions of conductive layer 330. Where conductive layer 330 is an electroless copper, such remnant electroless copper may be removed by flash etching. The result of removal is to leave the structure with defined openings to dielectric layer 320 in areas where conductive vias are desired. In one embodiment, fiducials are positioned in hard mask 350 that can be detected by a laser drilling system and used to identify the defined openings.

FIG. 18 shows an example of a via formation process. In this embodiment, vias are formed through dielectric layer 320 to conductive layer 310 (e.g., traces) using a laser drilling process. FIG. 18 shows laser beam 360 (a coherent emission of electromagnetic radiation) being directed over the structure forming via openings in dielectric layer 320. FIG. 18 shows completed via 365A, completed via 365B and partially completed via 365C with laser beam 360 being directed through hard mask 350 at dielectric layer 320 to form via 365C. The process continues until each of the desired vias is completed to conductive layer 310. As illustrated, the beam is focused on openings in hard mask 350 to drill the vias. In one embodiment, a size of a laser beam is selected to be slightly larger than the size of the opening. In one embodiment, the beam is positioned by reading fiducials on dielectric layer 320. In one embodiment, such fiducials are placed on top of dielectric layer 320, and are therefore not obscured by the dielectric material. In another embodiment, the vias may be formed using laser projection patterning where a beam is directed to scan hard mask 350 and drill in openings in hard mask 350.

FIG. 19 shows the structure of FIG. 18 following the completion of via 365A, via 365B, via 365C, via 365D and via 365E. Following the completion of each via to conductive layer 310, hard mask 350 is removed. Where hard mask is an electroplated copper material, the hard mask may be removed by etching. Vias 365A-365E are then desmeared.

FIG. 20 shows the structure of FIG. 19 following the introduction of a seed layer as a blanket over dielectric layer 320 and in vias 365A-365C. In one embodiment, seed layer 370 in a copper material introduced by an electroless process.

FIG. 21 shows the structure of FIG. 20 following the introduction and patterning of masking material on the structure using photolithographic techniques to expose the vias. In one embodiment, a suitable masking material (masking material 375) is a DFR that may be laminated and patterned to expose vias 365A-365B. Masking material 375, in one embodiment, will define openings for the conductive through vias and the same pads can be used as lithography pads. The self-aligned via drilling process described above allows an alignment of lithography pads on top of laser opened vias (lithography pads are self-aligned to the vias). In one embodiment, this tends to save space around pads for routing traces compared to prior processes that defined lithography pads by aligning a lithography tool to fiducials drilled by laser in dielectric material (fiducials under ABF). The result in such a prior art process is that the size or area of the pads is greater than the area in dielectric layer 320 of the via opening (e.g., greater than a via diameter by 30 microns) to ensure proper alignment of the lithography pad on top of the laser-opened via. The bigger (greater area) lithography pad reduces the number of traces that can be routed at that particular level.

FIG. 22 shows the structure of FIG. 21 following the introduction of conductive material in vias 365A-365E. In one embodiment, conductive material of, for example, copper, is introduced by an electroplating process to form conductive through vias 380A, 380B, 380C, 380D and 380E.

FIG. 23 shows the structure of FIG. 22 following the removal of masking layer 375. For a masking layer of, for example, 375, such layer may be removed by stripping.

FIG. 24 shows the structure of FIG. 23 following the removal of remnants of a seed layer 370. For a seed layer of an electroless copper, such remnant electroless copper may be removed by flash etching. The introduction and patterning of a conductive layer to the conductive through vias may then proceed using, for example, lithographic and plating techniques.

Referring to FIG. 24, a top portion of the conductive through vias 380A-380E define a respective lithography pad (illustrated by identifier 385 for conductive through via 380A). As illustrated, in this embodiment, the lithography pads are self-aligned to the vias in which the conductive through vias are formed. In other words, the lithography pads do not extend laterally onto a surface of dielectric layer 320 but have a diameter confined to a diameter of the respective via. Since the self-aligned pads are confined to the respective via area, the area around the vias (i.e., area on a surface of dielectric layer 320) is available for routing of conductive traces.

Figure 25:
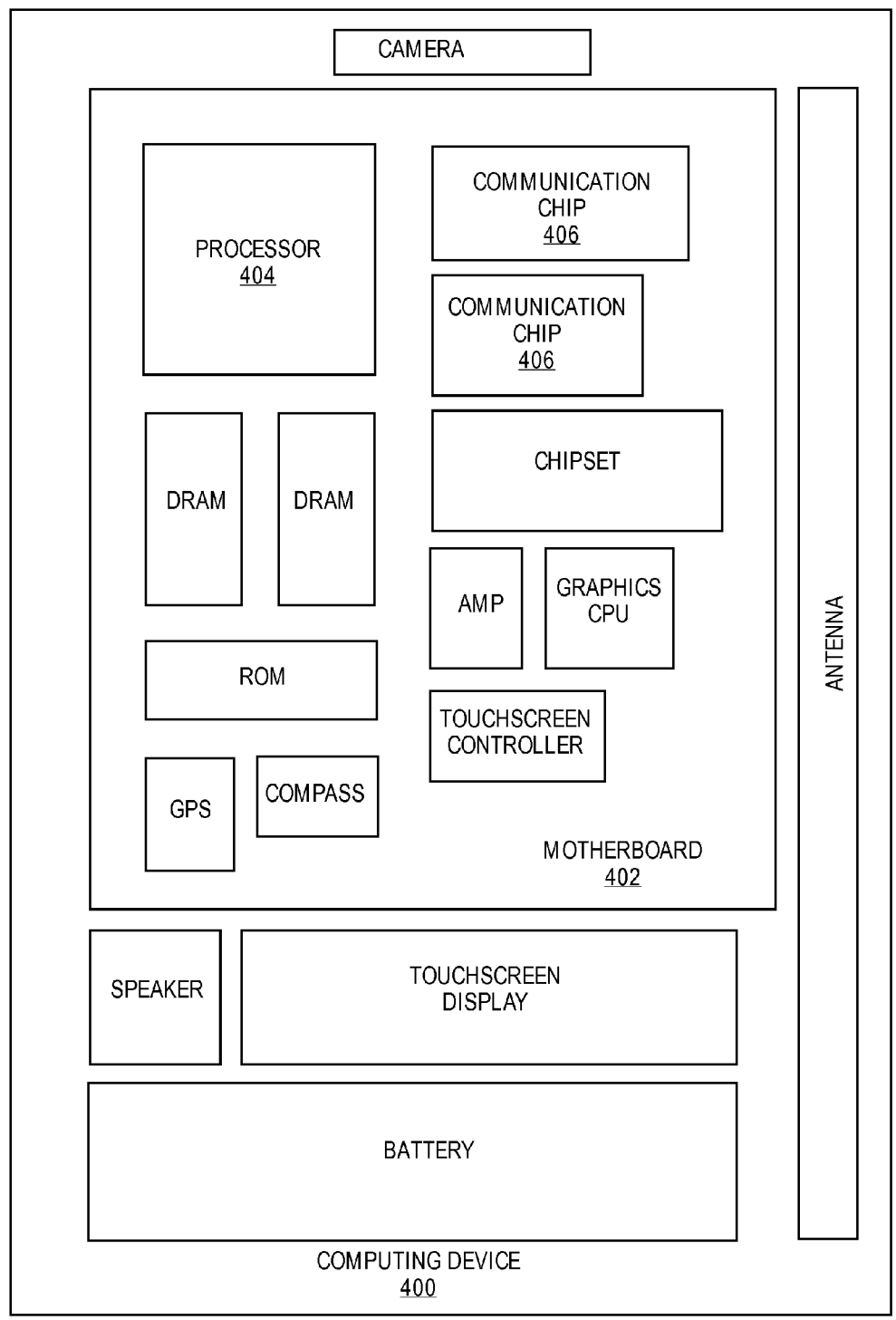
FIG. 25 illustrates a computing device in accordance with one implementation.

FIG. 25 illustrates a computing device 400 in accordance with one implementation. The computing device 400 houses board 402. Board 402 may include a number of components, including but not limited to processor 404 and at least one communication chip 406. Processor 404 is physically and electrically connected to board 402. In some implementations at least one communication chip 406 is also physically and electrically connected to board 402. In further implementations, communication chip 406 is part of processor 404.

Depending on its applications, computing device 400 may include other components that may or may not be physically and electrically connected to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations, the package formed in accordance with embodiment described above utilizes BBUL technology such as described with reference to FIGS. 1-24. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, a package including a communication chip incorporates one or more capacitors such as described above.

In further implementations, another component housed within computing device 400 may contain a microelectronic package including a BBUL package such as described above.

In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

The following examples pertain to embodiments:

Example 1 is an apparatus including a die having a thickness dimension that includes a dielectric material on contact points on a device side of the die, the die also including a die area defined by a length dimension and a width dimension; an insulating layer surrounding the die area and embedding the thickness dimension of the die; and a build-up carrier having a carrier area greater than the die area, the build-up carrier including a plurality of layers of conductive material disposed on the device side of the die, a first one of the layers of conductive materials being formed on the insulating layer and patterned into traces at least a portion of which are connected to respective contact points on the die.

In Example 2, the insulating layer embedding a thickness dimension of the die of the apparatus of Example 1 includes an epoxy.

In Example 3, the insulating layer of the apparatus of Example 1 embeds side walls of the dielectric material such that the insulating layer and the dielectric material collectively define a surface and the traces of the first one of the layers of conductive materials are connected to conductive vias through the dielectric material to respective contact points on the die.

In Example 4, the dielectric material on the die of the apparatus of Example 1 includes a thickness profile along its perimeter with an irregular surface.

Example 5 is a method including disposing a die on a sacrificial substrate with a device side of the die opposite the sacrificial substrate; disposing a mold on the sacrificial substrate around a length and width dimension of the die, the mold including a chase including a depth at least equal to a thickness dimension of the die; introducing an insulating material into the chase; removing the mold; forming a build-up carrier on the insulating material adjacent a device side of a die, wherein the build-up carrier includes a plurality of layers of conductive material and dielectric material, a first one of the layers of conductive materials being formed on the insulating material and patterned into traces at least a portion of which are connected to contact points on the die; and separating the die and the build-up carrier from the sacrificial substrate.

In Example 6, the device side of the die in the method of Example 5 includes a dielectric material, vias through the dielectric material to contact points of the die and a conductive film on the dielectric material and forming the first one of the layers of conductive material includes depositing a conductive seed material on the insulating material; patterning a mask material on the conductive seed material having openings to define traces to at least a portion of the vias; depositing a conductive material through the openings in the masking material; and removing the masking material.

In Example 7, the device side of the die in the method of Example 5 includes a dielectric material and prior to introducing the insulating material into the chase of the mold, the method includes creating an irregular surface in the dielectric material around a portion of the perimeter of the die.

In Example 8, forming the build-up carrier in the method of Example 5 includes forming a dielectric material on the first one of the layers of conductive materials; patterning a mask having openings to the first one of the layers of conductive materials; forming vias in the dielectric material; after forming vias, removing the mask; depositing conductive material in the vias to form conductive vias.

In Example 9, patterning a mask in the method of Example 5 includes introducing a conductive seed layer on the dielectric material; introducing and patterning a sacrificial material on the conductive seed layer, wherein patterning includes patterning to define openings to the conductive seed layer; electroplating a conductive material on the conductive seed layer.

In Example 10, forming fiducials on the dielectric material layer and forming vias in the method of Example 8 includes laser drilling.

In Example 11, after removing the mask and prior to depositing conductive material in the vias in the method of Example 8 includes introducing a conductive seed layer on the dielectric material; and introducing a mask material on the conductive seed layer, the mask material having openings exposing the vias.

In Example 12, after depositing conductive material in the vias in the method of Example 11 includes removing the mask material.

Example 13 is an apparatus including a package including a microprocessor including a first side and an opposite second side comprising a device side with contact points and a microprocessor area defined by a length dimension and a width dimension; an insulating layer surrounding the microprocessor area and embedding the thickness dimension of the microprocessor; a build-up carrier on the insulating layer, the build-up carrier including a plurality of layers of conductive material disposed on the device side of the microprocessor, a first one of the layers of conductive materials being formed on the insulating layer and patterned into traces at least a portion of which are connected to respective contact points on the microprocessor; a plurality of carrier contact points on a side of the build-up carrier opposite the insulating layer, wherein at least one of the plurality of carrier contact points is coupled to at least one of the layers of conductive materials; and a printed circuit board coupled to the carrier contact points.

In Example 14, the microprocessor in the apparatus of Example 13 includes a dielectric material on a device side of the microprocessor and the insulating layer and the dielectric material collectively define a surface and the first one of the layers of conductive materials is coupled to conductive vias through the dielectric material to the respective contact points on the microprocessor.

In Example 15, the die in the apparatus of Example 13 includes a dielectric material on the device side including a thickness profile along its perimeter with an irregular surface.

In Example 16, one or more of the plurality of conductive layers in the apparatus of Example 13 is coupled to another of the plurality of conductive layers by at least one conductive through via, the at least one conductive through via defining a lithography pad that is self-aligned to the via in which it is formed.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
a die having a thickness dimension that includes a dielectric material on contact points on a device side of the die, the die also comprising a die area defined by a length dimension and a width dimension;
an insulating layer surrounding the die area and embedding the thickness dimension of the die; and
a build-up carrier having a carrier area greater than the die area, the build-up carrier comprising a plurality of layers of conductive material disposed on the device side of the die with successive layers of conductive material separated by dielectric material, a first one of the layers of conductive materials being formed on the insulating layer and patterned into traces and a first level of conductive vias to respective contact points on the die, the traces disposed on a surface defined by the dielectric material and the insulating layer.

2. The apparatus of claim 1, wherein the insulating layer embedding a thickness dimension of the die comprises an epoxy.

3. The apparatus of claim 1, wherein the dielectric material on the die comprises a thickness profile along its perimeter with an irregular surface.

4. A method comprising:
disposing a die on a sacrificial substrate with a device side of the die opposite the sacrificial substrate, the die comprising a thickness dimension that includes a dielectric material on the device side;
disposing a mold on the sacrificial substrate around a length and width dimension of the die, the mold comprising a chase comprising a depth at least equal to the thickness dimension of the die;
introducing an insulating material into the chase;
removing the mold;
forming a build-up carrier on the insulating material adjacent a device side of a die, wherein the build-up carrier comprises a plurality of layers of conductive material with successive layers conductive material separated by dielectric material, a first one of the layers of conductive materials being formed on the insulating material and patterned into traces and a first level of conductive vias to contact points on the die, the traces disposed on a surface defined by the dielectric material and the insulating layer; and
separating the die and the build-up carrier from the sacrificial substrate.

5. The method of claim 4, wherein the device side of the die comprises vias through the dielectric material to contact points of the die and a conductive film on the dielectric material and forming the first one of the layers of conductive material comprises:
depositing a conductive seed material on the insulating material;
patterning a mask material on the conductive seed material having openings to define traces to at least a portion of the vias;
depositing a conductive material through the openings in the masking material; and
removing the masking material.

6. The method of claim 4, prior to introducing the insulating material into the chase of the mold, the method comprises creating an irregular surface in the dielectric material around a portion of the perimeter of the die.

7. The method of claim 4, wherein forming the build-up carrier comprises:
forming a dielectric material on the first one of the layers of conductive materials;
patterning a mask having openings to the first one of the layers of conductive materials;
forming vias in the dielectric material;
after forming vias, removing the mask; and
depositing conductive material in the vias to form conductive vias.

8. The method of claim 7, wherein patterning a mask comprises:
introducing a conductive seed layer on the dielectric material;
introducing and patterning a sacrificial material on the conductive seed layer, wherein patterning comprises patterning to define openings to the conductive seed layer; and
electroplating a conductive material on the conductive seed layer.

9. The method of claim 7, further comprising forming fiducials on the dielectric material layer and forming vias comprises laser drilling.

10. The method of claim 7, wherein after removing the mask and prior to depositing conductive material in the vias, the method comprises:
introducing a conductive seed layer on the dielectric material; and
introducing a mask material on the conductive seed layer, the mask material having openings exposing the vias.

11. The method of claim 10, wherein after depositing conductive material in the vias, removing the mask material.

12. An apparatus comprising:
a package comprising a microprocessor comprising a first side and an opposite second side comprising a device side with contact points and a microprocessor area defined by a length dimension and a width dimension;
an insulating layer surrounding the microprocessor area and embedding the thickness dimension of the microprocessor;
a build-up carrier on the insulating layer, the build-up carrier comprising:
a plurality of layers of conductive material disposed on the device side of the microprocessor with successive layers of conductive material separated by dielectric material, a first one of the layers of conductive materials being formed on the insulating layer and patterned into traces and a first level of conductive vias to respective contact points on the microprocessor, the traces disposed on a surface defined by the dielectric material and the insulating layer;

a plurality of carrier contact points on a side of the build-up carrier opposite the insulating layer, wherein at least one of the plurality of carrier contact points is coupled to at least one of the layers of conductive materials; and a printed circuit board coupled to the carrier contact points.

13. The apparatus of claim 12, wherein the microprocessor comprises a dielectric material on the device side comprising a thickness profile along its perimeter with an irregular surface.

14. The apparatus of claim 12, wherein one or more of the plurality of conductive layers is coupled to another of the plurality of conductive layers by at least one conductive through via, the at least one conductive through via defining a lithography pad that is self-aligned to the via in which it is formed.

* * * * *